United States Patent
Ohtsuka et al.

(10) Patent No.: US 6,990,006 B2
(45) Date of Patent: Jan. 24, 2006

(54) NON-VOLATILE MEMORY CELL AND A METHOD OF CONTROLLING THE SAME

(75) Inventors: Takashi Ohtsuka, Toyonaka (JP); Kenji Toyoda, Osaka (JP)

(73) Assignee: Matsushita Electric Industrial Co., LTD, Osaka (JP)

( * ) Notice: Subject to any disclaimer, the term of this patent is extended or adjusted under 35 U.S.C. 154(b) by 0 days.

(21) Appl. No.: 10/829,235

(22) Filed: Apr. 22, 2004

(65) Prior Publication Data

US 2004/0196689 A1 Oct. 7, 2004

Related U.S. Application Data

(63) Continuation of application No. PCT/JP03/14692, filed on Nov. 19, 2003.

(30) Foreign Application Priority Data

Nov. 25, 2002 (JP) .............................. 2002-340588

(51) Int. Cl.
    *G11C 11/22* (2006.01)
(52) U.S. Cl. .......................... 365/145; 365/65
(58) Field of Classification Search ................ 365/145, 365/190, 230.08, 154
    See application file for complete search history.

(56) References Cited

U.S. PATENT DOCUMENTS

| | | | |
|---|---|---|---|
| 5,198,706 A * | 3/1993 | Papaliolios | 365/145 |
| 5,406,510 A * | 4/1995 | Mihara et al. | 365/145 |
| 5,751,627 A | 5/1998 | Ooishi | |
| 5,936,879 A * | 8/1999 | Brouwer et al. | 365/145 |
| 6,038,161 A * | 3/2000 | Fuchikami | 365/145 |
| 6,141,237 A * | 10/2000 | Eliason et al. | 365/145 |
| 6,240,013 B1 | 5/2001 | Nishimura | |
| 6,285,575 B1 | 9/2001 | Miwa | |
| 6,707,702 B1 * | 3/2004 | Komatsuzaki | 365/145 |
| 6,738,281 B2 * | 5/2004 | Yokozeki | 365/145 |

FOREIGN PATENT DOCUMENTS

| | | |
|---|---|---|
| EP | 0 530 928 | 3/1993 |
| JP | 64-66899 | 3/1989 |
| JP | 08-180672 | 7/1996 |
| JP | 08-264728 | 10/1996 |
| JP | 2000-293989 | 10/2000 |
| JP | 2000-331482 | 11/2000 |

\* cited by examiner

*Primary Examiner*—Thong Q. Le
(74) *Attorney, Agent, or Firm*—McDermott Will & Emery LLP

(57) ABSTRACT

A non-volatile memory cell comprising a latch circuit (1) which comprises a first node (6) and a second node (7) and latches complementary data set in the first node (6) and the second node (7), a first switching element (4) which connects the first node (6) and a first data input/output line (2), a second switching element (5) which connects the second node (7) and a second data input/output line (3), a first ferroelectric capacitor (8a) which connects the second data input/output line (3) and the first node (6), and a second ferroelectric capacitor (8b) which connects the first data input/output line (2) and the second node (7).

19 Claims, 11 Drawing Sheets ial NON-VOLATILE MEMORY CELL AND A
METHOD OF CONTROLLING THE SAME

This is a continuation of Application No. PCT/JP03/14692, filed Nov. 19, 2003.

BACKGROUND OF THE INVENTION (1) Field of the Invention

The present invention relates to a non-volatile memory cell using a ferroelectric capacitor, and a method of controlling the same.

(2) Description of the Related Art

In recent years, the widespread use of portable devices has been driving the demand for non-volatile memories. Non-volatile memories which have been developed or suggested until now include flash memories, those called FERAMs utilizing the polarization of ferroelectric substances, those called MRAMs utilizing magnetic resistance, and those utilizing phase change materials, etc.

Especially, many non-volatile memory cells using ferroelectric capacitors have been suggested, and memory cells having a high-speed latch function and a non-volatile memory function have been also suggested. For example, there is a circuit which is generally called a shadow RAM and disclosed in the Japanese Patent No. 2692641 (hereinafter referred to as "reference 1") and Japanese Unexamined Patent Publication No. 2000-293989 (hereinafter referred to as "reference 2").

The circuit diagram of the shadow RAM disclosed in reference 1 is shown in FIG. 10. The circuit shown in FIG. 10 is configured to comprise a data latch section consisting of a pair of inverters, a pair of data lines, a control line, a pair of control transistors connected between the data lines and control line and a pair of ferroelectric capacitors connected between the data lines and the control line. The circuit of FIG. 10 usually operates in a similar manner to a flip-flop using the data lines. In order to achieve non-volatility, however, it operates in a different manner from a normal flip-flop. Specifically, the circuit controls the potential of the control line and saves data as the polarization states of the ferroelectric capacitors immediately before power is removed (hereinafter referred to as "STORE"). When power is turned on, the original data is recalled depending on the polarization states of the ferroelectric capacitors (hereinafter referred to as "RECALL").

The circuit diagram of the shadow RAM disclosed in reference 2 is shown in FIG. 11. This circuit is configured to comprise a data latch section consisting of a pair of inverters, a pair of bit lines, a plate line, a pair of control transistors which connect the bit lines to the data latch section, a pair of ferroelectric capacitors connected between the data latch section and the plate line. Select transistors which select a cell in the shadow RAM are omitted in FIG. 11. The circuit turns on the select transistors and writes data during normal operation. Similarly, latched data is read by turning on the select transistors. In contrast, the STORE of data when power is removed is different from the normal flip-flop operation, the data in the latch section is written into the ferroelectric capacitors using the plate line. Also in the RECALL when power is turned on, the original data is recalled by controlling the potential of the plate line.

However, the above known non-volatile memory cells have the following problems:

In the circuits of FIGS. 10 and 11, in the STORE, unlike in the flip-flop operation, the data of the latch section is written into the ferroelectric capacitors using the control line or plate line. That is, in order to control the polarization reversal operation of the ferroelectric capacitor, at least another signal line such as the control line or plate line is necessary. Accordingly, a control signal for the signal line must be transmitted to the memory cell using an additional line. These circuits, therefore, need to have additional control lines and plate lines, which increases the number of electric wires. This disadvantage has been preventing the circuits from being used for FPGAs, which have a large number of electric wires by themselves.

In normal flip-flop operation, to prevent voltage application to the ferroelectric capacitors, the potential approximately half the height of the supply voltage is applied to the plate line. However, a ferroelectric capacitor shows a minor loop which indicates that a certain degree of polarization is caused with the application of a voltage, even if it is lower than the coercive electric field. Therefore, the potentials of the storage nodes of the data latch section become easily displaced by the minor loop of the ferroelectric capacitors. Therefore, the relationship between the capacitance of the ferroelectric capacitor and the drive ability of the inverter which constitutes the data latch section must be set appropriately. However, it is difficult to design this relationship appropriately. As a result, the retained potential becomes unstable during normal latch operation, and there arises the problem of being unable to keep the operation stable.

Furthermore, although the relationship between the coercive electric field and the electric field of a polarization saturation point varies with ferroelectric substance materials, many kinds of ferroelectric capacitors usually have the electric field of a polarization saturation point twice as high as the coercive electric field or higher. Therefore, it is difficult to cause the saturation polarization of a ferroelectric capacitor unless the potential of a plate line is biased to a level equal to or higher than the ground potential or supply potential. For this reason, the capacitor would need to use a special booster circuit. Otherwise, even if a voltage about half the height of the supply voltage is preliminarily applied to the plate line, only an electric field twice as high as a normal electric field, at the highest, could be applied to the ferroelectric capacitor. That is, when a voltage about half the height of the supply voltage is applied to the plate line, an electric field equal to or lower than the coercive electric field is desirably applied to the ferroelectric capacitor. Considering this, even if the potential of the plate line is changed to the supply potential or the ground potential, it would be difficult to apply an electric field which causes the polarization saturation of the ferroelectric substance to the ferroelectric capacitor.

BRIEF SUMMARY OF THE INVENTION

An object of the present invention is to suggest a non-volatile memory cell which uses a ferroelectric capacitor, has less electric wires than known non-volatile memory cells and enables stable flip-flop operation, and a method of controlling the same.

A first non-volatile memory cell according to the present invention which can attain the above object comprises: a latch circuit which comprises a first node and a second node and latches complementary data set in the first node and second node; a first switching element which connects the first node to a first data input/output line; a second switching element which connects the second node to a second data input/output line; a first ferroelectric capacitor which connects the second data input/output line to the first node; and a second ferroelectric capacitor which connects the first data input/output line to the second node.

A first method of controlling a non-volatile memory cell according to the present invention which can attain the above object comprises: a latch circuit which comprises a first node and a second node and latches complementary data set in the first node and the second node; a first switching element which connects the first node to a first data input/output line; a second switching element which connects the second node to a second data input/output line; a first ferroelectric capacitor which connects the second data input/output line to the first node; and a second ferroelectric capacitor which connects the first data input/output line and the second node; the method comprising a STORE step and a RECALL step; the STORE step comprising setting the potential of one of the first and second data input/output lines to a high level, setting the potential of the other data input/output line to a low level and turning on the first and second switching elements; the RECALL step comprising a first substep and a second substep; the first substep comprising setting the potential of a power line of the latch circuit to a ground potential, setting the potentials of the first and second data input/output lines to the ground potential and turning on the first and second switching elements; the second substep, which follows the first substep, comprising, in the state that the potentials of the first and second data input/output lines are maintained at the ground potential, turning off the first and second switching elements and increasing the potential of the power line of the latch circuit.

A second non-volatile memory cell according to the present invention which can attain the above object comprises: a latch circuit which comprises a first node and a second node and latches complementary data set in the first node and the second node; a first switching element which connects the first node to a first data input/output line; a second switching element which connects the second node to a second data input/output line; a first ferroelectric capacitor and a second ferroelectric capacitor select element which are serially connected between the second data input/output line and the first node; and a second ferroelectric capacitor and a first ferroelectric capacitor select element which are serially connected between the first data input/output line and the second node; the first ferroelectric capacitor being connected to the first node; and the second ferroelectric capacitor being connected to the second node.

A second method of controlling a non-volatile memory cell according to the present invention which can attain the above object comprise: a latch circuit which comprises a first node and a second node and latches complementary data set in the first and second nodes; a first switching element which connects the first node to a first data input/output line; a second switching element which connects the second node to a second data input/output line; a first ferroelectric capacitor and a second ferroelectric capacitor select element which are serially connected between the second data input/output line and the first node; and a second ferroelectric capacitor and a first ferroelectric capacitor select element which are serially connected between the first data input/output line and the second node; the first ferroelectric capacitor being connected to the first node; and the second ferroelectric capacitor being connected to the second node; the method comprising a WRITE step, a READ step, a STORE step and a RECALL step; the WRITE step comprising turning off the first and second ferroelectric capacitor select elements, setting the potential of one of the first and second data input/output lines to a high level and the potential of the other data input/output line to a low level, turning on the first and second switching elements, and setting the potentials of the first and second nodes to those of the first and second data input/output lines respectively; the READ step comprising turning off the first and second ferroelectric capacitor select elements, turning on the first and second switching elements, and setting the potentials of the first and second data input/output lines to those of the first and second nodes respectively; the STORE step comprising, in the state that complementary data are latched into the latch circuit, turning on the first and second ferroelectric capacitor select elements and the first and second switching elements; the RECALL step comprising a first substep and a second substep; the first substep comprising setting the potential of a power line of the latch circuit to the ground potential, setting the potentials of the first and second data input/output lines to the ground potential, and turning on the first and second switching elements and the first and second ferroelectric capacitor select elements; and the second substep, which follows the first substep, comprising, in the state that the first and second ferroelectric capacitor select elements are maintained in the ON state and the potentials of the first and second data input/output lines are maintained at the ground potential, turning off the first and second switching elements and increasing the potential of the power line of the latch circuit.

A third method of controlling a non-volatile memory cell according to the present invention which can attain the above object comprise: a latch circuit which comprises a first node and a second node and latches complementary data set in the first and second nodes; a first switching element which connects the first node to a first data input/output line; a second switching element which connects the second node to a second data input/output line; a first ferroelectric capacitor and a second ferroelectric capacitor select element which are serially connected between the second data input/output line and the first node; and a second ferroelectric capacitor and a first ferroelectric capacitor select element which are serially connected between the first data input/output line and the second node; the first ferroelectric capacitor being connected to the first node; and the second ferroelectric capacitor being connected to the second node; the method comprising a WRITE step, a READ step, a STORE step and a RECALL step; the WRITE step comprising turning off the first and second ferroelectric capacitor select elements, setting the potential of one of the first and second data input/output lines to a high level and the potential of the other data input/output line to a low level, turning on the first and second switching elements, and setting the potentials of the first and second nodes to those of the first and second data input/output lines respectively; the READ step comprising turning off the first and second ferroelectric capacitor select elements, turning on the first and second switching elements, and setting the potentials of the first and second data input/output lines to those of the first and second nodes respectively; the STORE step comprising setting the potential of one of the first and second data input/output lines to a high level and setting the potential of the other data input/output line to a low level, according to the complementary data latched into the latch circuit, and turning on the first and second ferroelectric capacitor select elements; the RECALL step comprising a first substep and a second substep; the first substep comprising setting the potential of a power line of the latch circuit to the ground potential, setting the potentials of the first and second data input/output lines to the ground potential and turning on the first and second switching elements and the first and second ferroelectric capacitor select elements; and the second substep, which follows the first substep, comprising, in the state that the first and second ferroelectric capacitor select elements are maintained in the ON state and the potentials of the first and second data input/output lines are maintained at the ground potential, turning off the first and second switching elements and increasing the potential of the power line of the latch circuit.

A third non-volatile memory cell according to the present invention which can attain the above object comprises: a latch circuit which comprises a first node and a second node and latches complementary data set in the first and second nodes; a first switching element and a first control element which are serially connected between the first node and a first data input/output line; a second switching element and a second control element which are serially connected between the second node and a second data input/output line; a second ferroelectric capacitor and a first ferroelectric capacitor select element which are serially connected between the second node and a third node, the third node serially connecting the first switching element and the first control element; and a first ferroelectric capacitor and a second ferroelectric capacitor select element which are serially connected between the first node and a fourth node, the fourth node serially connecting the second switching element and the second control element; the first switching element being connected to the first node; the second switching element being connected to the second node; the first ferroelectric capacitor being connected to the first node; and the second ferroelectric capacitor being connected to the second node.

A fourth method of controlling a non-volatile memory cell according to the present invention which can attain the above object comprise: a latch circuit which comprises a first node and a second node and latches complementary data set in the first and second nodes; a first switching element and a first control element which are serially connected between the first node and a first data input/output line; a second switching element and a second control element which are serially connected between the second node and a second data input/output line; a second ferroelectric capacitor and a first ferroelectric capacitor select element which are serially connected between the second node and a third node, the third node serially connecting the first switching element and the first control element; and a first ferroelectric capacitor and a second ferroelectric capacitor select element which are serially connected between the first node and a fourth node; the fourth node serially connecting the second switching element and the second control element, the first switching element being connected to the first node; the second switching element being connected to the second node; the first ferroelectric capacitor being connected to the first node; and the second ferroelectric capacitor being connected to the second node; the method comprising a WRITE step, a READ step, a STORE step and a RECALL step; the WRITE step comprising turning off the first and second ferroelectric capacitor select elements, setting the potential of one of the first and second data input/output lines to a high level and the potential of the other data input/output line to a low level, turning on the first and second switching elements and the first and second control elements, and setting the potentials of the first and second nodes to those of the first and second data input/output lines respectively; the READ step comprising turning off the first and second ferroelectric capacitor select elements, turning on the first and second switching elements and the first and second control elements, and setting the potentials of the first and second data input/output lines to those of the first and second nodes respectively; the STORE step comprising setting the potential of one of the first and second data input/output lines to a high level and the potential of the other data input/output line to a low level, according to the complementary data latched into the latch circuit, and turning on the first and second control elements and the first and second ferroelectric capacitor select elements; the RECALL step comprising a first substep and a second substep; the first substep comprising setting the potential of a power line of the latch circuit to the ground potential, setting the potentials of the first and second data input/output lines to the ground potential, and turning on the first and second switching elements, the first and second ferroelectric capacitor select elements and the first and second control elements; the second substep, which follows the first substep, comprising, in the state that the first and second ferroelectric capacitor select elements and the first and second control elements are maintained in the ON state and the potentials of the first and second data input/output lines are maintained at the ground potential, turning off the first and second switching elements and increasing the potential of the power line of the latch circuit.

A fifth method of controlling a non-volatile memory cell according to the present invention which can attain the above object comprise: a latch circuit which comprises a first node and a second node and latches complementary data set in the first and second nodes; a first switching element and a first control element which are serially connected between the first node and a first data input/output line; a second switching element and a second control element which are serially connected between the second node and a second data input/output line; a second ferroelectric capacitor and a first ferroelectric capacitor select element which are serially connected between the second node and a third node, the third node serially connecting the first switching element and the first control element; and a first ferroelectric capacitor and a second ferroelectric capacitor select element which are serially connected between the first node and a fourth node, the fourth node serially connecting the second switching element and the second control element; the first switching element being connected to the first node; the second switching element being connected to the second node; the first ferroelectric capacitor being connected to the first node; and the second ferroelectric capacitor being connected to the second node; the method comprising a WRITE step, a READ step, a STORE step and a RECALL step; the WRITE step comprising turning off the first and second ferroelectric capacitor select elements, setting the potential of one of the first and second data input/output lines to a high level and the potential of the other data input/output line to a low level, turning on the first and second switching elements and the first and second control elements, and setting the potentials of the first and second nodes to those of the first and second data input/output lines respectively; the READ step comprising turning off the first and second ferroelectric capacitor select elements, turning on the first and second switching elements and the first and second control elements, and setting the potentials of the first and second data input/output lines to those of the first and second nodes respectively; the STORE step comprising, in the state that the complementary data is latched into the latch circuit, turning off the first and second control elements and turning on the first and second switching elements and the first and second ferroelectric capacitor select elements; the RECALL step comprising a first substep and a second substep; the first substep comprising setting the potential of a power line of the latch circuit to the ground potential, setting the potentials of the first and second data input/output lines to the ground potential, turning on the first and second switching elements, the first and second ferroelectric capacitor select elements and the first and second control elements; the second substep, which follows the first substep, comprising, in the state that the first and second ferroelectric capacitor select elements and the first and second control elements are maintained in the ON state and the potentials of the first and second data input/output lines are maintained at the ground potential, turning off the first and second switching elements and increasing the potential of the power line of the latch circuit.

DETAILED DESCRIPTION OF THE INVENTION

Embodiments of the present invention will be described below referring to the accompanying drawings.

(First Embodiment)

Figure 1:
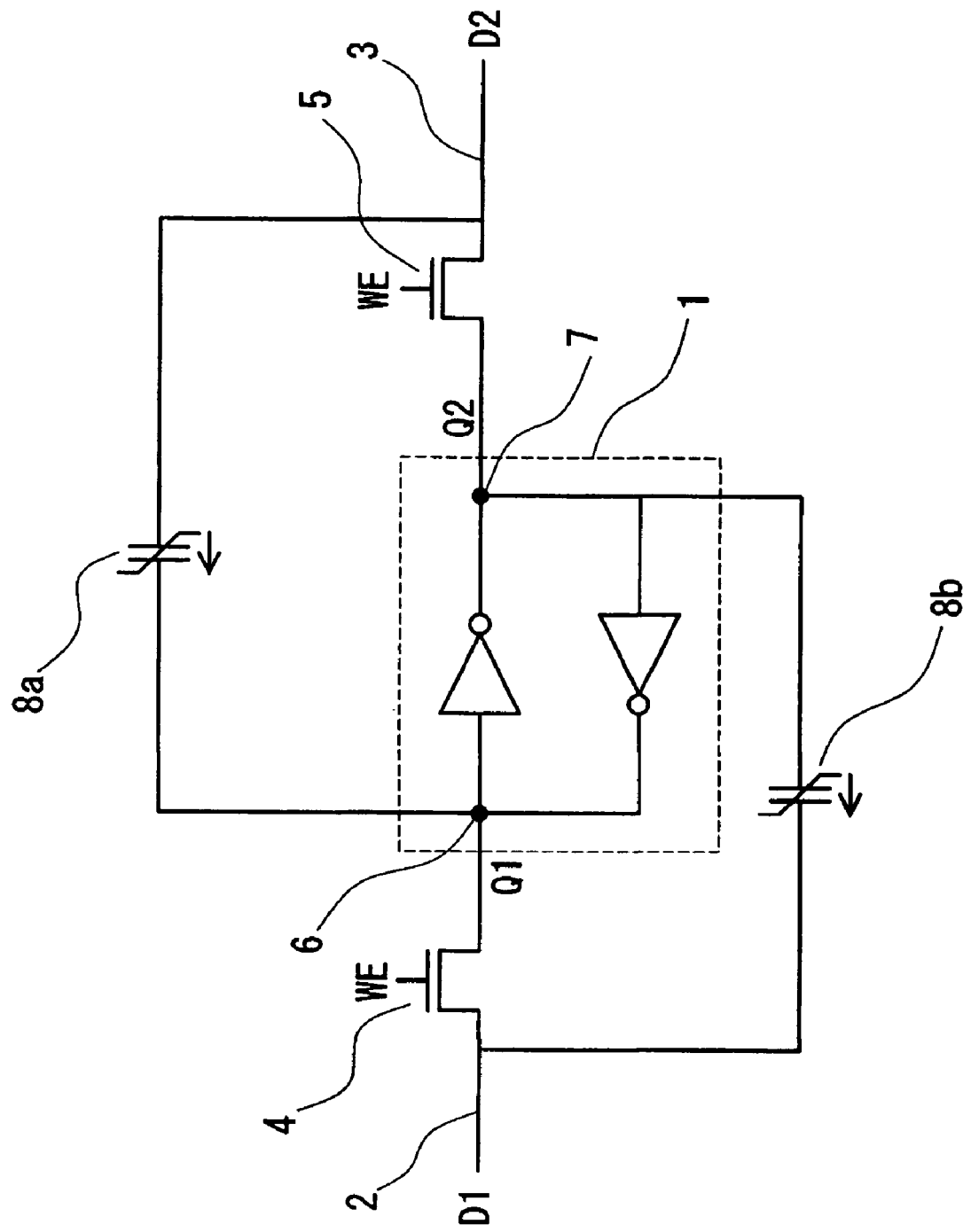
FIG. 1 is a circuit diagram showing the non-volatile memory cell according to the first embodiment of the present invention.

FIG. 1 is a circuit diagram showing the non-volatile memory cell according to the first embodiment of the present invention. The memory cell shown in FIG. 1 comprises a latch circuit 1, a first data input/output line 2, a second data input/output line 3, a first switching element 4, a second switching element 5, a first node 6, a second node 7, a first ferroelectric capacitor 8a and a second ferroelectric capacitor 8b. In this memory cell, the first node 6 is connected to the first data input/output line 2 via the first switching element 4, and the second node 7 is connected to the second data input/output line 3 via the second switching element 5. The first node 6 is connected to the second data input/output line 3 via the first ferroelectric capacitor 8a, and the second node 7 is connected to the first data input/output line 2 via the second ferroelectric capacitor 8b.

FIG. 1 shows the case where the latch circuit 1 consists of two inverters, each of which reverses an input signal, i.e., outputs a low potential when a high potential is inputted thereto and outputs a high potential when a low potential is inputted thereto, and the input terminal of one inverter is connected to the output terminal of the other inverter. In this latch circuit 1, when one of the first and second nodes 6 and 7 is set to have a high potential and the other is set to have a low potential, the state of the input potential and output potential of the inverters is consistent with the inverting function of the inverters. Thus, the potential state of the first and second nodes 6 and 7 is stably maintained.

Subsequently, the method of controlling the memory cell shown in FIG. 1 will be described. First, the method of controlling the memory cell in normal flip-flop operation will be described.

In normal flip-flop operation, the first and second data input/output lines 2 and 3 are preliminarily given complementary data (the state that one has a high potential and the other has a low potential). In other words, either the first or second data input/output lines 2 or 3 is set to have the supply potential, and the other input/output line is set to have the ground potential. When the first and second switching elements 4 and 5 are turned on in this state, data is latched into the first and second nodes 6 and 7. This means that data is written in the memory cell. This operation of writing data is similar to that of a normal flip-flop. After this write operation is completed, the first and second switching elements 4 and 5 are turned off, and the potentials of the first and second data input/output lines 2 and 3 are changed to the ground potential.

When data is read from the memory cell, the data latched into the latch circuit 1 is read from the first and second data input/output lines 2 and 3 by turning on the first and second switching elements 4 and 5. Thus, the data reading operation from this memory cell is similar to that of a normal flip-flop.

FIG. 1 shows the case where the pair of inverters is used as a latch circuit 1. However, the circuit is not limited to this configuration as long as it has a similar function. For example, it may be a latch circuit comprising inverters each of which comprises a pair of complementary transistors as shown in FIG. 2, or a resistor and a transistor as shown in FIG. 3.

Figure 2:
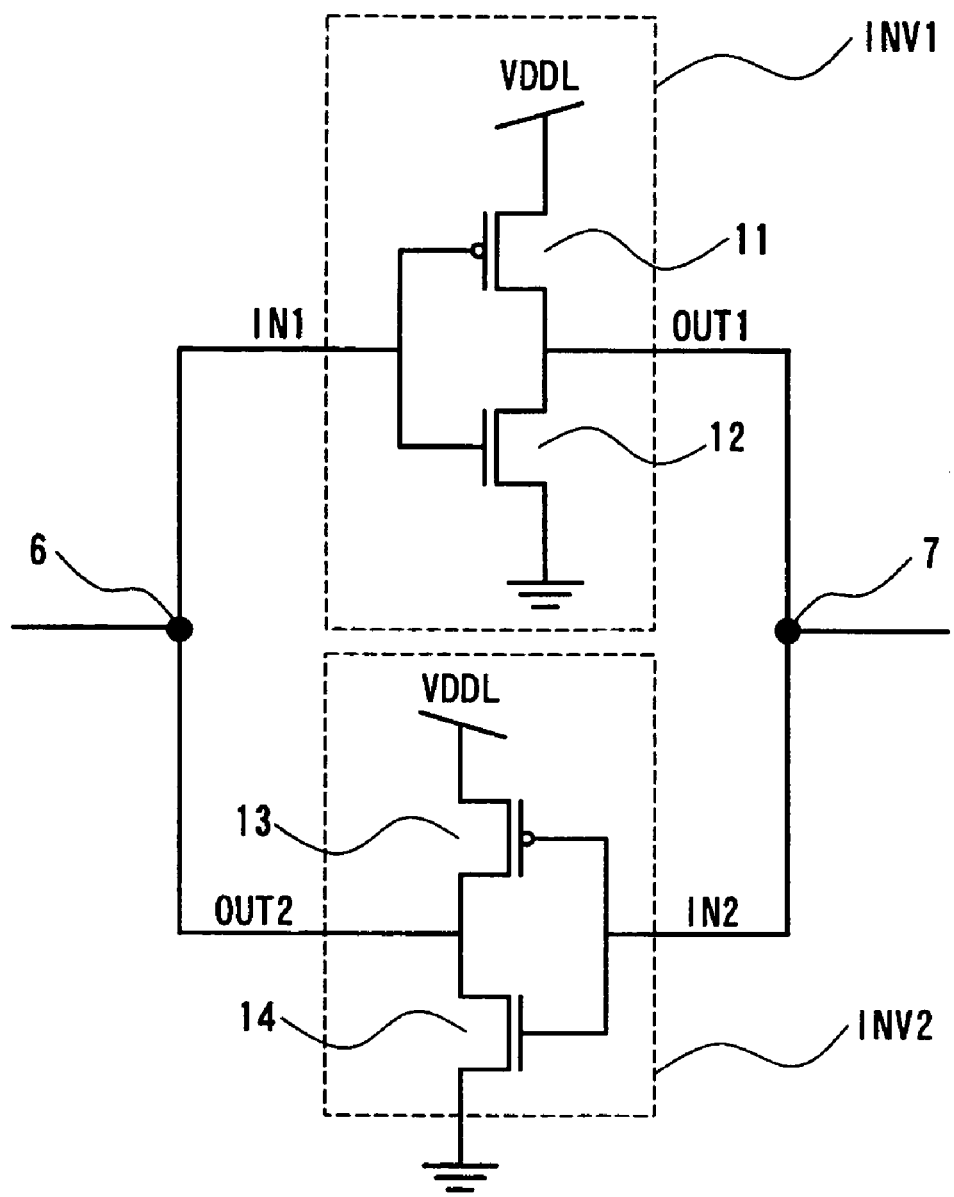
FIG. 2 is a circuit diagram showing the case where the latch circuit of FIG. 1 is constructed from transistors.

The latch circuit shown in FIG. 2 comprises first-fourth transistors 11–14. The first and third transistors 11 and 13 are P-channel transistors, while the second and fourth transistors 12 and 14 are N-channel transistors. The first and second transistors 11 and 12, and the third and fourth transistor 13 and 14 are serially connected between a power line VDDL and the ground, forming first and second inverters INV1 and INV2, respectively. The sources of the first and second transistors 11 and 12 are connected to the power line VDDL and the ground, respectively. The gates of the first and second transistors 11 and 12 are connected to each other to form an input terminal IN1, while the drains of the first and second transistors 11 and 12 are connected to each other to form an output terminal OUT2. Similarly, the sources of the third and fourth transistors 13 and 14 are connected to the power line VDDL and the ground, respectively; the gates of the third and fourth transistors 13 and 14 are connected to each other to form an input terminal IN2; and the drains of the third and fourth transistors 13 and 14 are connected to each other to form an output terminal OUT2. The input terminal IN1 and output terminal OUT2 are connected via the first node 6, while the input terminal IN2 and output terminal OUT1 are connected via the second node 7.

In the latch circuit of FIG. 2, when either the first or second node 6 or 7 is set to have a high potential and the other node is set to have a low potential, this state is maintained. For example, when the first and second nodes 6 and 7 are set to have a high potential and a low potential, respectively, the second and third transistors 12 and 13 are turned on, and the first and fourth transistors 11 and 14 are turned off. Accordingly, the first node 6 is connected to the power line VDDL via the fourth transistor 14, and maintains its high potential, and the second node 7 is connected to the ground via the second transistor 12, and maintains its low potential. That is, the potentials of the first and second nodes 6 and 7 are maintained at the initial setting level.

Figure 3:
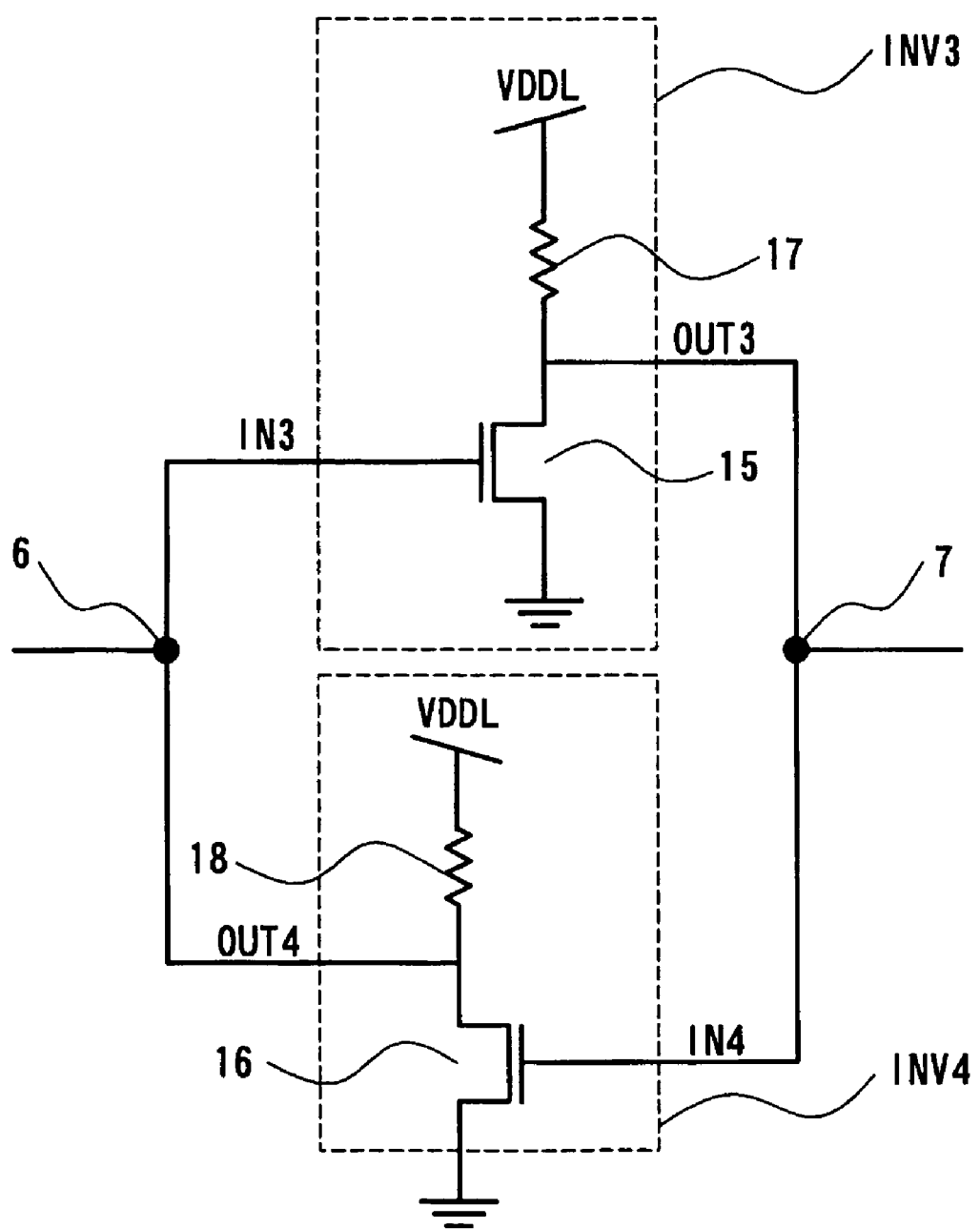
FIG. 3 is a circuit diagram showing the case where the latch circuit of FIG. 1 is constructed from transistors and resistors.

The latch circuit shown in FIG. 3 comprises the fifth and sixth transistors 15 and 16, and the first and second resistors 17 and 18. The first resistor 17 and fifth transistor 15, and the second resistor 18 and sixth transistor 16, are serially connected between the power line VDDL and the ground, forming a third inverter INV3 and a fourth inverter INV4, respectively. One end of the first resistor 17 is connected to the power line VDDL, while the other end is connected to the drain of the fifth transistor 15 which is an N-channel transistor, forming an output terminal OUT3. The source of the fifth transistor is grounded and the gate of the fifth transistor is an input terminal IN3. Similarly, one end of the second resistor 18 is connected to the power line VDDL, while the other end is connected to the drain of the sixth transistor 16 which is an N-channel transistor, forming an output terminal OUT4. The source of the sixth transistor is grounded and the gate of the sixth transistor is an input terminal IN4. The input terminal IN3 and output terminal OUT4 are connected via the first node 6, while the input terminal IN4 and output terminal OUT3 are connected via the second node 7.

In the latch circuit of FIG. 3, if the resistance values of the first and second resistors 17 and 18 are set sufficiently high, and one of the first and second nodes 6 and 7 is set to have a high potential and the other node is set to have a low potential, that state is stably maintained. For example, when the first and second nodes 6 and 7 are set to have a high potential and a low potential, respectively, the fifth transistor 15 is turned on and the sixth transistor 16 is turned off. Accordingly, the first node 6 is connected to the power line VDDL via the second resistor 18, and maintains its high potential. In contrast, the second node 7 is connected to the ground via the fifth transistor 15, and its potential becomes equal to the value caused by dividing the supply potential in accordance with the ratio of the resistance value of the first resistance 17 to the ON-resistance value of the fifth transistor 15. Therefore, if the resistance value of the first resistance 17 is sufficiently higher than the ON-resistance value of the fifth transistor 15, the second node 7 maintains the low potential. That is, the potentials of the first and second nodes 6 and 7 are maintained at the initial settings. When the first and second nodes 6 and 7 are set to have a low potential and a high potential, respectively, and the resistance value of the second resistance 18 is sufficiently higher than the ON-resistance value of the sixth transistor 16, the potentials of the first and second nodes 6 and 7 are maintained at the initial settings, similarly.

Figure 4:
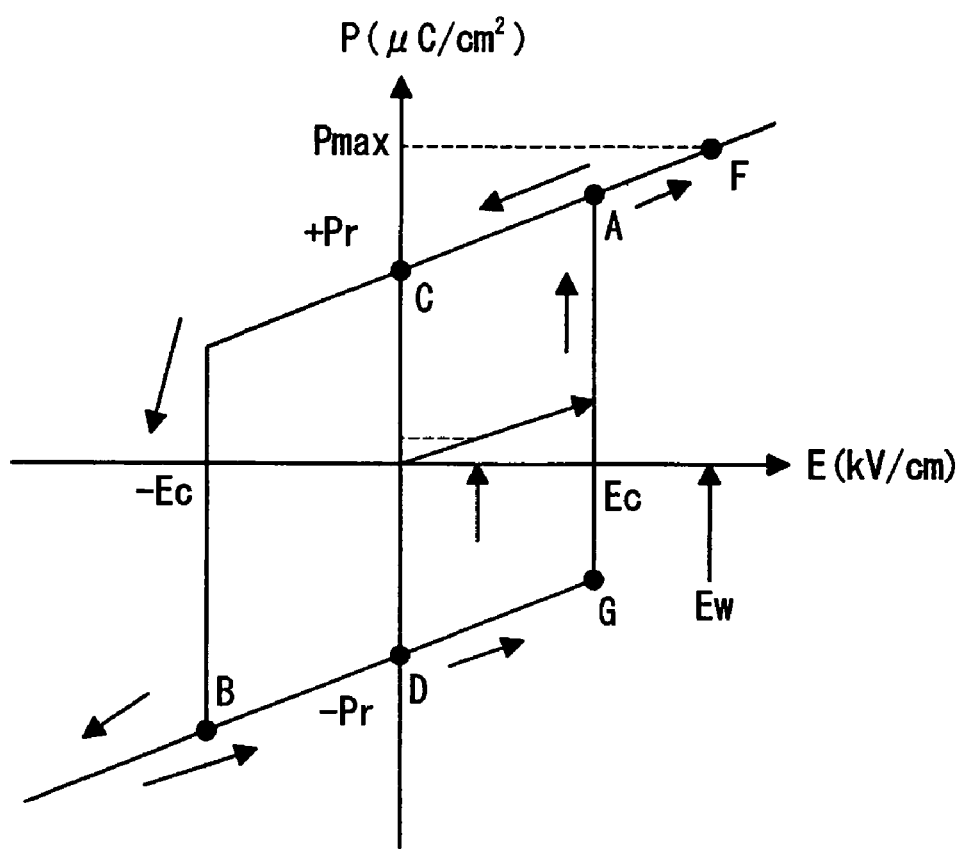
FIG. 4 shows the relationship between the electric field applied to the ferroelectric capacitor and polarization.

In normal flip-flop operation, when the first and second switching elements 4 and 5 are turned on, the voltage Vdd−Vg−Vth, i.e., the value obtained by subtracting the threshold voltage (Vth) of the first and second switching elements 4 and 5 from the difference of the supply potential (Vdd) and the ground potential (Vg), is always applied between terminals of each of the first and second ferroelectric capacitors 8a and 8b. Dielectric polarization occurs in the first and second ferroelectric capacitors 8a and 8b, depending on the applied voltage. FIG. 4 shows the relationship between dielectric polarization and the electric field which is generated by the application of a voltage between terminals.

Dielectric polarization is caused in the first and second ferroelectric capacitors 8a and 8b by the application of a voltage. The polarization state changes according to the hysteresis curve shown in FIG. 4. The electric field by which polarization is reversed is called a coercive electric field Ec. When the difference in the potentials of both terminals becomes greater than the coercive voltage (voltage corresponding to the coercive electric field Ec), the polarization of the first and second ferroelectric capacitors 8a and 8b are reversed. In this embodiment, the first and second ferroelectric capacitors 8a and 8b are set to have one terminal having the supply potential, and the other terminal having the ground potential when data is written in normal flip-flop operation. Thus, the electric field equal to or higher than the coercive electric field Ec is applied to the first and second ferroelectric capacitors 8a and 8b. Even when the electric field between both terminals of the ferroelectric capacitors is removed, the state where residual polarization is induced is maintained. The amount of the residual polarization after the electric field is removed changes depending on the direction of the electric field. Non-volatility can be achieved by using this dependency in a manner described later.

Figure 5:
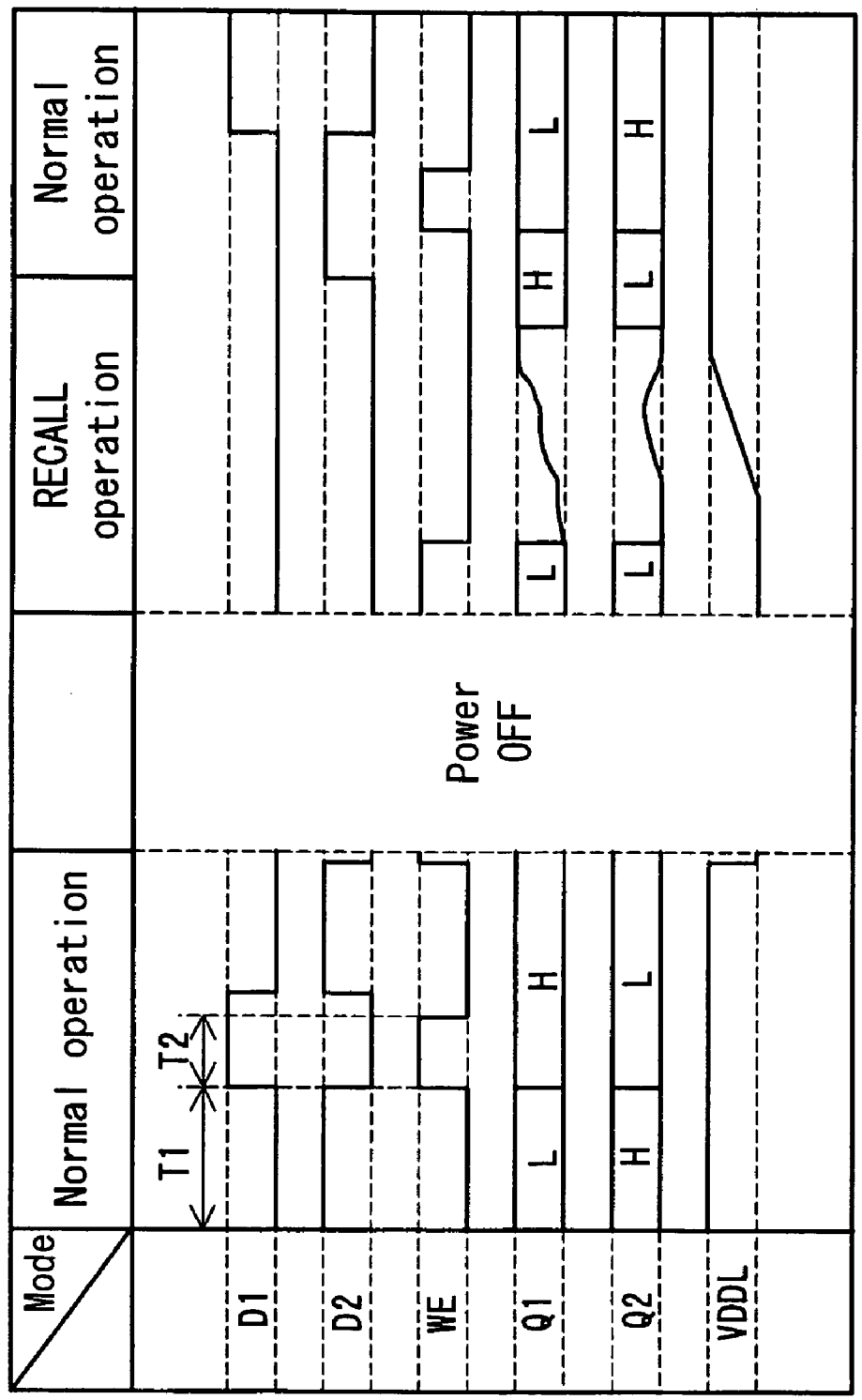
FIG. 5 is a timing chart for controlling the non-volatile memory cell according to the first embodiment of the present invention.

FIG. 5 is a timing chart which shows the above-described operations. In FIG. 5, D1 represents the potential of a first data input/output line 2; D2 represents the potential of a second data input/output line 3; and WE represents the potential of the gates of the first and second switching elements 4 and 5. Q1 and Q2 represent the potentials of the first and second nodes 6 and 7, respectively, and VDDL represents the potential of the power line of the inverter which constitutes a latch circuit 1. Herein, the potential D2 of the second data input/output line 3 changes according to the changing pattern which is obtained by reversing the changing pattern of the potential D1 of the first data input/output line 2, i.e., reversing a high level (high potential) and a low level (low potential) of the potential D1, except during the recall operation described later.

A first period T1 in the normal operation mode of FIG. 5 represents the initial state before data writing. At this time, D1 is set at a low level; D2 is set at a high level; WE is set at a low level; and the first and second switching elements 4 and 5 are turned off. In FIG. 5, it is assumed that Q1 is at a low level (L) and Q2 is at a high level (H) in the initial state. A second period T2 following the first period T1 is a write period, during which D1 is set at a high level, D2 is set at a low level, and WE is set at a high level. Thus, the first and second switching elements 4 and 5 are turned on, and the potentials of the first and second nodes 6 and 7 are set to D1 and D2, respectively. That is, Q1 is set at a high level (H), and Q2 is set at a low level (L). Then, Q1 and Q2 are maintained at a high level (H) and a low level (L), respectively, by the latch circuit 1, even if WE and D1 are set at a low level.

Subsequently, the STORE and RECALL for achieving non-volatile function will be described.

The STORE does not need any special write operation. This is because in this embodiment, polarization is always induced in the first and second ferroelectric capacitors 8a and 8b during the operation as a flip-flop, and thus data is stored, as already stated. In terms of operational stability, it is desirable that there is no difference in the potentials of both terminals of each of the first and second ferroelectric capacitors 8a and 8b when power to the memory cell is removed. For example, the power line of the inverter of the latch circuit 1 is set at the ground potential; the first and second switching elements 4 and 5 are turned on, and then the potentials of the first and second data input/output lines 2 and 3 are set to the ground potential. This procedure avoids an unwanted difference in the potentials of both terminals of each of the first and second ferroelectric capacitors 8a and 8b, that is, equalizes the potentials.

By these operations, the data corresponding to the potentials of the first and second nodes 6 and 7 is stored in the first and second ferroelectric capacitors 8a and 8b.

Subsequently, the RECALL will be described. The RECALL operation is performed as follows:

When power supply to the non-volatile memory cell is started, first, the potential of the power line (not shown in FIG. 1) of the latch circuit 1 is set to the ground potential, and the potentials D1 and D2 of the first and second data input/output lines 2 and 3 are set to the ground potential. In this state, the first and second switching elements 4 and 5 are turned on. By this operation, the potentials of both the first and second nodes 6 and 7 become the same ground potential.

Then, the first and second switching elements 4 and 5 are turned off. Next, the potential of the power line of the inverters which constitute the latch circuit 1 is increased. That is, for example, the potential of the power line VDDL of the inverters shown in FIG. 2 or 3 is increased.

At this time, the directions of the polarization of the first and second ferroelectric capacitors 8a and 8b are opposite to each other. That is, as shown in FIG. 4, the polarization of one of the first and second ferroelectric capacitors 8a and 8b is +Pr (point C), and the polarization of the other capacitor is −Pr (point D). The effective dielectric constant when a voltage is applied to the first and second ferroelectric capacitors 8a and 8b may vary with the direction of polarization, that is, depending on whether the voltage causes a polarization reversal or not. In other words, when the capacitors have the polarization of +Pr and are forward-biased, they perform like paraelectric substances. On the other hand, when the capacitors have the polarization of −Pr and are forward-biased, they cause a polarization reversal in the vicinity of the coercive electric field Ec. Therefore, their effective dielectric constants will vary. Specifically, when the potential VDDL of the power line of the latch circuit 1 is increased, the potentials of the first and second nodes 6 and 7 start to increase. However, the effective dielectric constants of the first and second ferroelectric capacitors 8a and 8b vary depending on the polarization states of the first and second ferroelectric capacitors 8a and 8b connected thereto, respectively. Therefore, there arises a difference between the increasing rates of the potentials of the first and second nodes 6 and 7. When the supply voltage is further increased above the threshold voltage of the inverters which constitute the latch circuit 1, one of the potentials Q1 and Q2 of the first and second nodes 6 and 7 changes to the supply potential, and the potential of the other node changes to the ground potential depending on the polarization states of the first and second ferroelectric capacitors 8a and 8b. Thus, the RECALL operation is completed.

The STORE and RECALL operations will be described in more detail with reference to FIGS. 1 and 4.

As already stated, the STORE is automatically performed when a write operation is performed, as in a general flip-flop. That is, during a write period (second period T2 in FIG. 5), WE is set to a high level so that the first and second switching elements 4 and 5 are maintained in the ON state. Herein, assume that as shown in FIG. 5, the potential D1 of the first data input/output line 2 and the potential Q1 of the first node 6 are at a high level, and the potential D2 of the second data input/output line 3 and the potential Q2 of the second node 7 are at a low level. In this case, the first ferroelectric capacitor 8a is polarized in the direction of the adjacent arrow shown in FIG. 1, which corresponds to point A in FIG. 4. The second ferroelectric capacitor 8b is polarized in the direction of the adjacent arrow shown in FIG. 1, which corresponds to point B in FIG. 4. The arrows are drawn from the low level to the high level.

When power is removed in this state, the state of the first ferroelectric capacitor 8a changes from point A to point C, and the state of the second ferroelectric capacitor 8b changes from point B to point D. Then these states are maintained. Thus, the STORE operation is completed.

When the power supply to the non-volatile memory cell is started, the RECALL operation starts. In the RECALL operation, as shown in FIG. 5, firstly the potential VDDL of the power line of the inverters which constitute the latch circuit 1 is set to the ground potential, and the potentials D1 and D2 of the first and second data input/output lines 2 and 3 are both set to the ground potential. In this state, the first and second switching elements 4 and 5 are turned on. This makes the first and second nodes 6 and 7 to have the same ground potential.

Secondly, the first and second switching elements 4 and 5 are turned off. Then, the potential VDDL of the power line of the inverters which constitute the latch circuit 1 is increased.

Accordingly, the state of the first ferroelectric capacitor 8a changes from point C to point F via point A in FIG. 4. Therefore, the first ferroelectric capacitor 8a becomes to serve as a paraelectric substance. This polarization of the first ferroelectric capacitor 8a is not reversed. This is because the second data input/output line 3 which is connected to one terminal of the first ferroelectric capacitor 8a has the ground potential, and when the potential of the first node 6 which is connected to the other terminal increases (the potential of the first node 6 does not become negative), voltages are applied to both terminals of the first ferroelectric capacitor 8a so that an electric field occurs in the direction of the adjacent arrow shown in FIG. 1.

Meanwhile, the state of the second ferroelectric capacitor 8b changes continuously from point B to D, G, A and F in FIG. 4. When the state changes from point G to point A, the polarization tends to reverse. This reversal requires an electric charge, and hence the effective dielectric constant becomes high. For this reason, when the potential of the power line of the inverters which constitute the latch circuit 1 is increased, the increasing rate of the potential of the second node 7 which is connected to the second ferroelectric capacitor 8b is lower than that of the potential of the first node 6 which is connected to the first ferroelectric capacitor 8a. This delay creates a difference between the potentials of the first node 6 and the second node 7. When this difference becomes greater than the threshold of the inverters which constitute the latch circuit 1, the potentials of the first and second nodes 6 and 7 change to the supply potential and ground potential, respectively. Thus, the RECALL operation is completed.

Described above is the RECALL operation after the STORE operation is performed with D1 and D2 at a high level and a low level, respectively. However, unlike in this case, when the STORE operation is performed with D1 and D2 at a low level and a high level, respectively, the potentials of the first and second nodes 6 and 7 are set to the ground potential and supply potential, respectively, by the RECALL operation. In other words, the stored potential states of the nodes can be recalled in both cases.

As seen from the above, according to the non-volatile memory cell of this embodiment and the method of controlling the same, operations of both a normal flip-flop and a non-volatile memory mentioned above can be achieved without using special additional electric wires. Therefore, it is easy to apply the memory cell according to this embodiment to devices with a large number of electric wires, such as FPGAs.

When the above non-volatile memory cell is constructed, the first and second ferroelectric capacitors 8a and 8b can be formed of a material which is used in ferroelectric memories such as $SrBi_2Ta_2O_9$ (SBT), $Bi_4Ti_3O_{12}$ (BIT), $(Pb,Zr)TiO_3$ (PZT), a ferroelectric material based on these substances or a material having ferroelectricity. The production process can be any known process for producing ferroelectric memories.

Although FIG. 5 shows the case where the first and second switching elements 4 and 5 are N-channel transistors, they are not limited to these but may be any elements that perform ON and OFF operations according to control signals, for example, P-channel transistors.

(Second Embodiment)

The non-volatile memory cell according to the second embodiment of the present invention and the method for controlling the same will be described with reference to FIG. 6.

Figure 6:
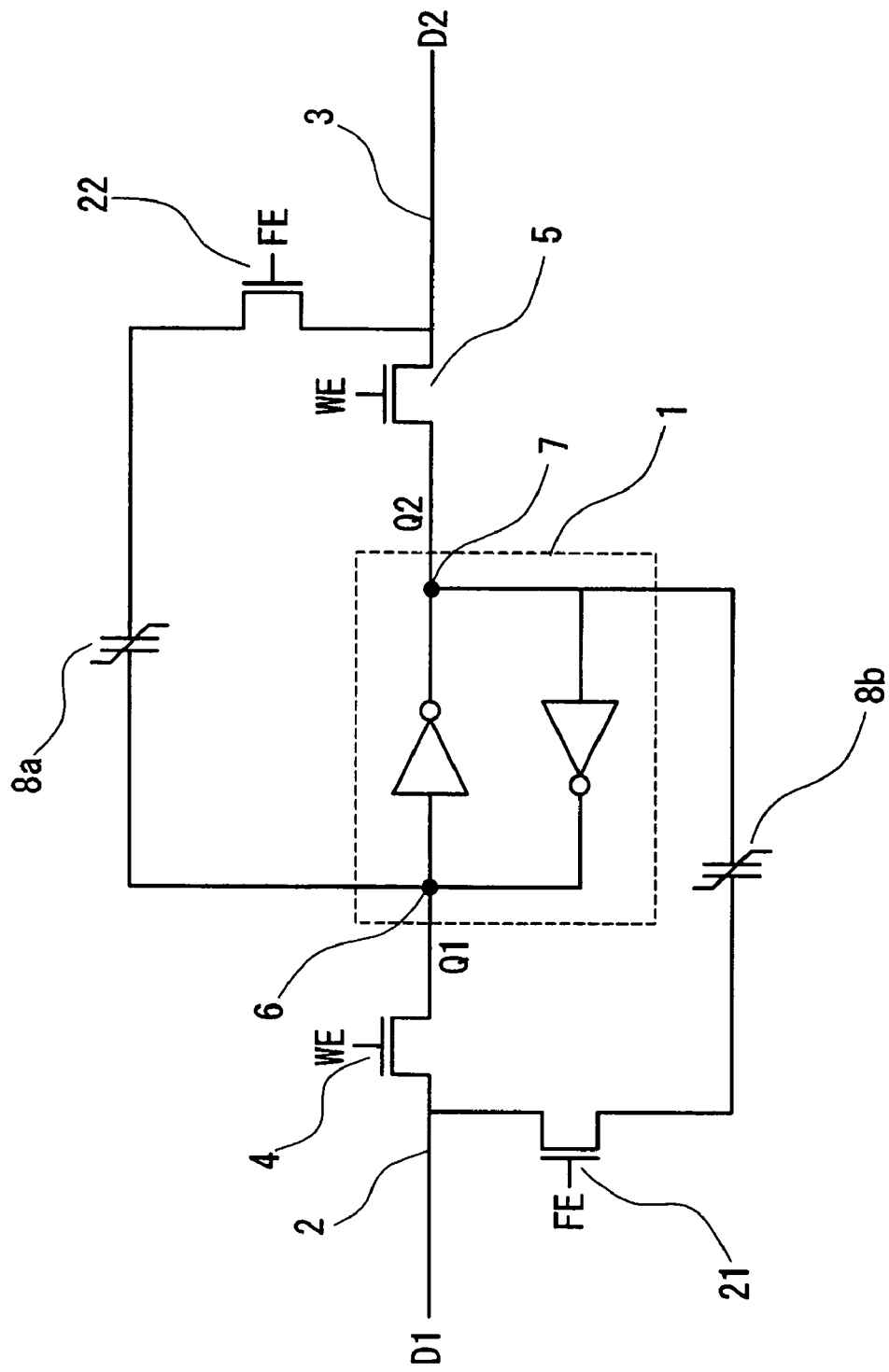
FIG. 6 is a circuit diagram showing the non-volatile memory cell according to the second embodiment of the present invention.

FIG. 6 is a circuit diagram of the non-volatile memory cell according to this embodiment. The circuit diagram of FIG. 6 differs from that of FIG. 1 (first embodiment) in that a first ferroelectric capacitor select element 21 is connected between the first data input/output line 2 and the second ferroelectric capacitor 8b, and that a second ferroelectric capacitor select element 22 is connected between the second data input/output line 3 and first ferroelectric capacitor 8a. In FIG. 6, the components which are common to those in the circuit diagram of FIG. 1 are denoted by the same symbols, and their explanations are omitted.

The first and second ferroelectric capacitor select elements 21 and 22 are to electrically disconnect the first and second ferroelectric capacitors 8a and 8b from the first and second data input/output lines 2 and 3. Specifically, in normal flip-flop operation, the first and second ferroelectric capacitor select elements 21 and 22 are turned off to disconnect the first and second ferroelectric capacitors 8a and 8b from the first and second data input/output lines 2 and 3. In this state, data is written and read according to the timing chart shown in FIG. 5 by controlling the potential WE.

Figure 7:
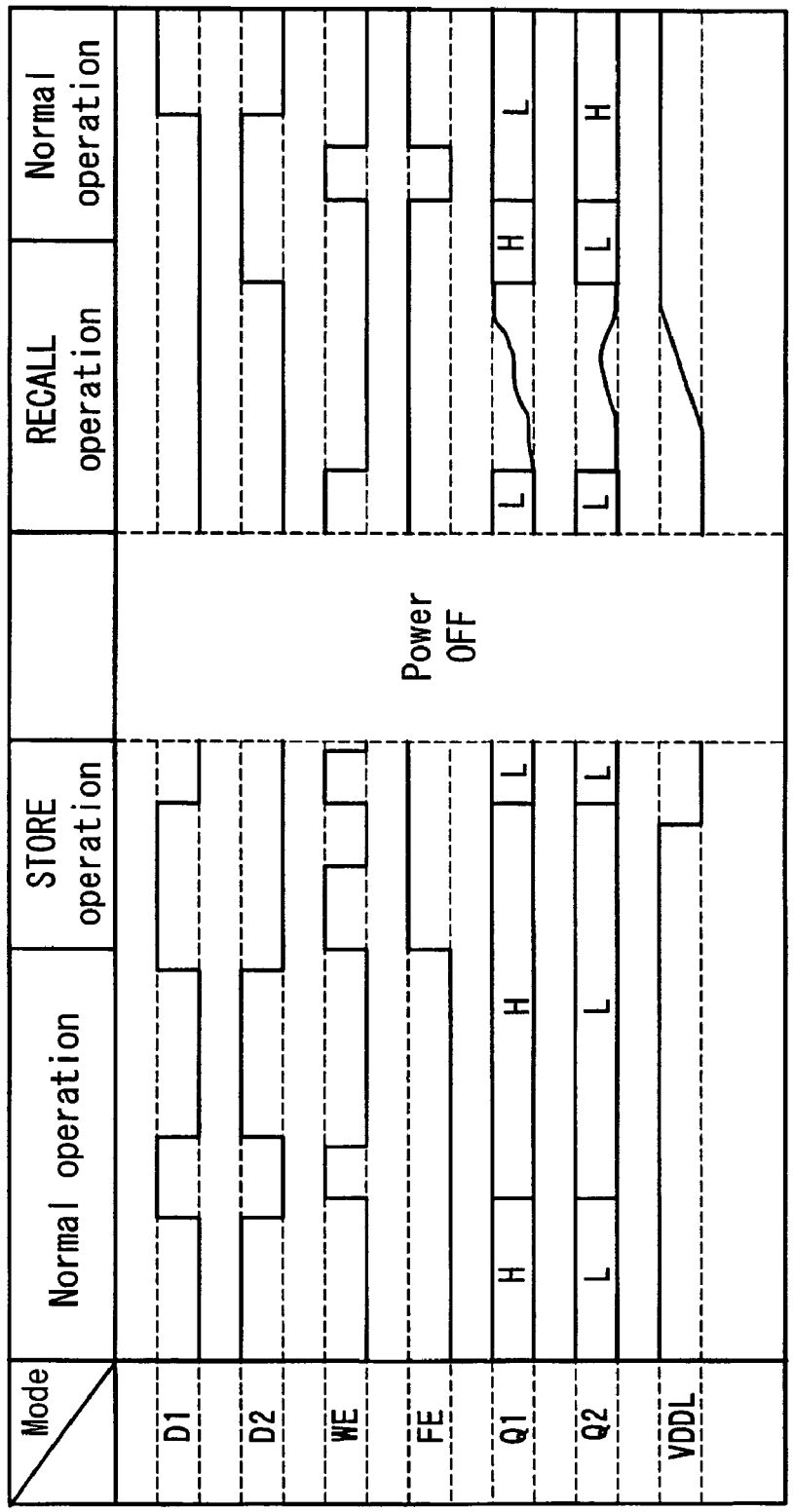
FIG. 7 is a timing chart for controlling the non-volatile memory cell according to the second embodiment of the present invention.

FIG. 7 shows the timing chart for controlling the non-volatile memory circuit shown in FIG. 6. In FIG. 7, FE represents the potential of the gates of the first and second ferroelectric capacitor select elements 21 and 22. The other symbols have the same meanings as in FIG. 5.

The operational reliability in normal operation is improved by disconnecting the first and second ferroelectric capacitors 8a and 8b from the first and second data input/output lines 2 and 3 during normal flip-flop operation. More specifically, the first and second ferroelectric capacitors 8a and 8b can be prevented from polarization reversal during normal flip-flop operation, that is, unnecessary polarization reversal operation can be inhibited, and therefore an increase in power consumption caused by polarization reversal can be prevented. In addition, the electric influence by the first and second ferroelectric capacitors 8a and 8b can be removed during normal flip-flop operation. This enables high-speed and stable operation.

The STORE is automatically performed in normal flip-flop operation in the circuit of FIG. 1. However, in the circuit of FIG. 6, as demonstrated in the STORE operation mode in FIG. 7, it is necessary to turn on the first and second switching elements 4 and 5, turn on the first and second ferroelectric capacitor select elements 21 and 22, and save the complementary data latched as the polarization states of the first and second ferroelectric capacitors 8a and 8b, before power to the non-volatile memory cell is removed. When the complementary data corresponding to the data latched are set in the first and second data input/output lines 2 and 3, the STORE operation is possible even if the first and second switching elements 4 and 5 are turned off, as long as the first and second ferroelectric capacitor select elements 21 and 22 are turned on.

When power to the non-volatile memory cell is removed as in the first embodiment, it is desirable to do so in the state that there is no difference in the potentials of both terminals of each of the first and second ferroelectric capacitors 8a and 8b. For this reason, the potential of the power line of the inverters of the latch circuit 1 is set to the ground potential; the potentials of the first and second data input/output lines 2 and 3 are set to the ground potential; and the first and second switching elements 4 and 5 and the first and second ferroelectric capacitor select elements 21 and 22 are turned on. Then, power to the memory cell is removed.

As shown in the RECALL operation mode in FIG. 7, the RECALL operation is performed in the manner as described in the first embodiment in the state that the potential FE is at a high level and the first and second ferroelectric capacitor select elements 21 and 22 are in the ON state. Specifically, when power to the non-volatile memory cell is supplied, WT and FE are set to a high level and the first and second switching elements 4 and 5 and the first and second ferroelectric capacitor select elements 21 and 22 are turned on, in the state that the potential VDDL of the power line of the inverters which constitute the latch circuit 1 is set to the ground potential, and the potentials D1 and D2 of the first and second data input/output lines 2 and 3 are both set to the ground potential. Thus, the potentials of the first and second nodes 6 and 7 are set to the same ground potential.

Next, in the state that FE is maintained at a high level to maintain the first and second ferroelectric capacitor select elements 21 and 22 in the ON state and the potentials of the first and second data input/output lines D1 and D2 are maintained at the ground potential, WT is changed to a low level and the first and second switching elements 4 and 5 are turned off. Then, the potential VDDL of the power line of the inverters which constitute the latch circuit 1 is increased.

Accordingly, when the RECALL operation is performed after the STORE operation is performed in the state that D1 and D2 are at a high level and a low level, respectively, as in the first embodiment, and the potential of the power line of the inverter which constitutes the latch circuit 1 is increased, the increasing rate of the potential of the second node 7 which is connected to the second ferroelectric capacitor 8b becomes lower than that of the first node 6 which is connected to the first ferroelectric capacitor 8a. This delay creates a difference in the potentials of the first node 6 and second node 7. When this difference exceeds the threshold potential of the inverter which constitutes the latch circuit 1, the potentials of the first and second nodes 6 and 7 change to the supply potential and ground potential, respectively. Thus, the RECALL operation is completed.

Described above is the case where the RECALL operation is performed after the STORE operation is performed with D1 and D2 at a high level and a low level, respectively. However, unlike in this case, when the STORE operation is performed with D1 and D2 at a low level and a high level, respectively, the potentials of the first and second nodes 6 and 7 are set to the ground potential and supply potential respectively, by the RECALL operation. In other words, the stored potential states of the nodes can be recalled in both cases.

As described above, according to the non-volatile memory cell of this embodiment and the method of controlling the same, as in the first embodiment, operations of both a normal flip-flop and a non-volatile memory can be achieved without using special additional electric wires. Furthermore, high-speed and stable operation and reduced power consumption can be achieved since the ferroelectric capacitors are disconnected in normal flip-flop operation.

FIG. 6 shows the case where the first and second ferroelectric capacitor select elements 21 and 22 are N-channel transistors. However, the elements are not limited to these and may be discrete transistors, or inverters (for example, clocked inverters) which can be turned on or off by control signals. Other elements having similar functions may also be used.

When simple MOSFET transistors are used, it is desirable to increase the gate bias to prevent a fall in the driving voltage, as is normally performed.

(Third Embodiment)

Figure 8:
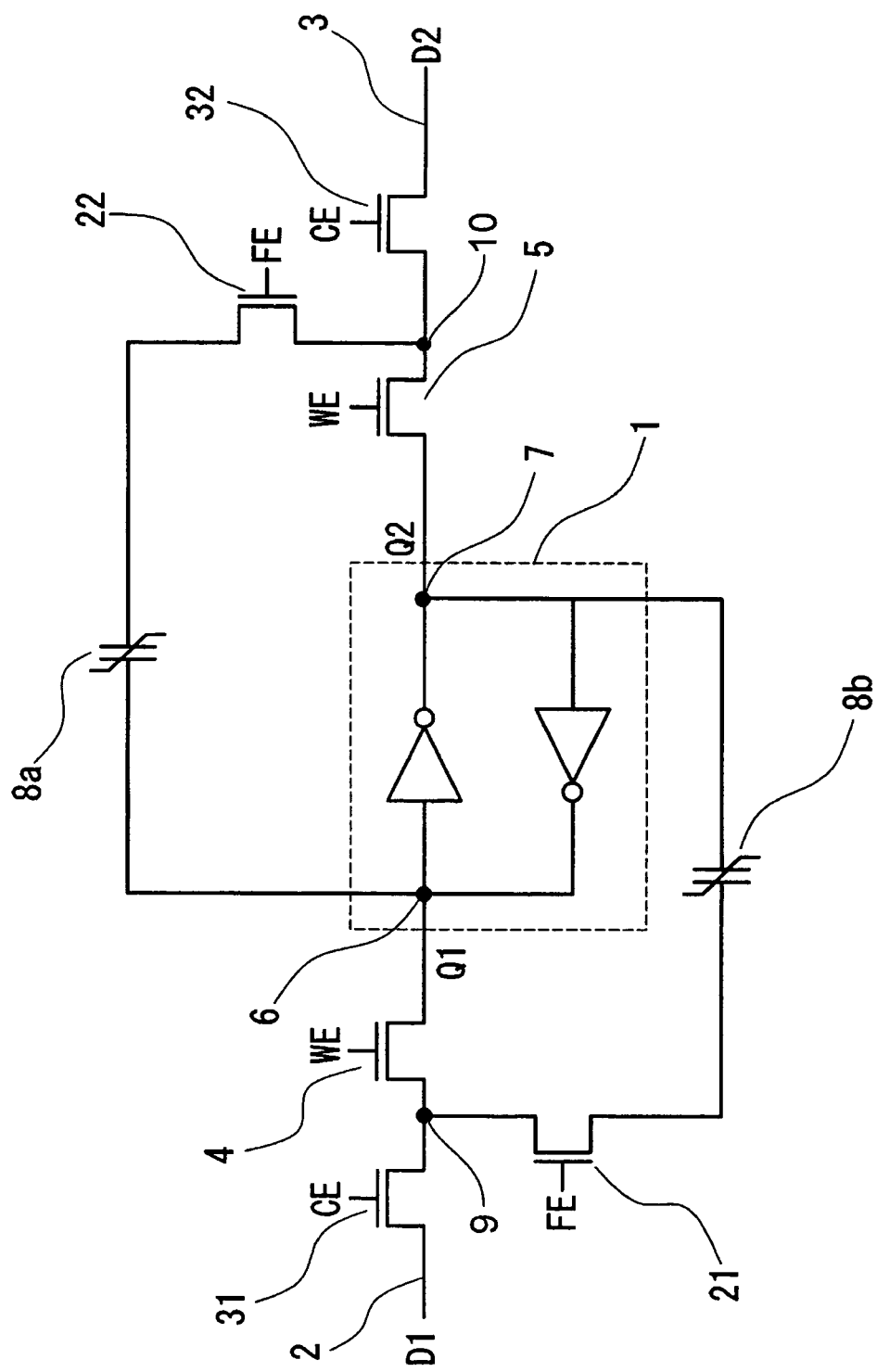
FIG. 8 is a circuit diagram showing the non-volatile memory cell according to the third embodiment of the present invention.

The non-volatile memory cell according to the third embodiment of the present invention and the method of controlling the same will be described with reference to FIG. 8. FIG. 8 is a circuit diagram showing the non-volatile memory cell according to this embodiment.

The circuit diagram of FIG. 8 differs from that of FIG. 6 (second embodiment) in the following points: a first control element 31 is connected between the first switching element 4 and the first data input/output line 2; the first ferroelectric capacitor select element 21 is connected to a third node 9 which serially connects the first switching element 4 and the first control element 31; a second control element 32 is connected between the second switching element 5 and the second data input/output line 3; and the second ferroelectric capacitor select element 22 is connected to a fourth node 10 which serially connects the second switching element 5 and the second control element 32. This allows the memory cell according to this embodiment to attain stable operations described later. In FIG. 8, the components which are common to those in the circuit diagrams of FIGS. 1 and 6 are denoted by the same symbols, and their explanations are omitted.

This memory cell enables, by the use of the first and second controlling elements 31 and 32, not only to electrically disconnect the first and second ferroelectric capacitors 8a and 8b from the latch circuit but also to be selected. Therefore, such a memory cell characteristically facilitates the selection of a memory cell when memory cells are arranged in an array. Regardless of whether the first and second ferroelectric capacitors 8a and 8b are electrically disconnected or not, the use of the first and second control elements 31 and 32, which function as switching elements, allows to select the memory cell itself. In other words, the memory cell itself can be electrically disconnected from the first and second data input/output lines 2 and 3 by turning off both first and second controlling elements 31 and 32.

Figure 9:
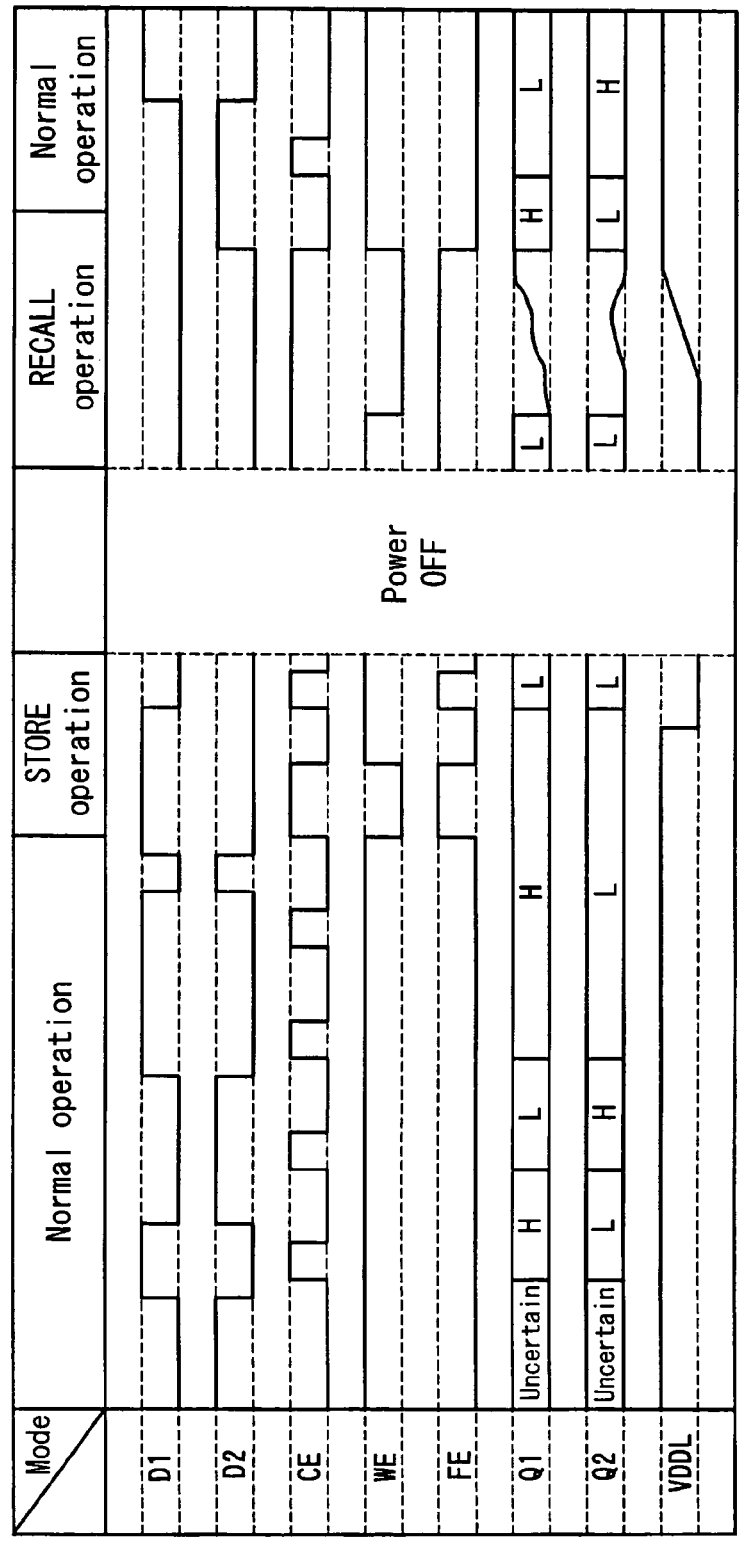
FIG. 9 is a timing chart for controlling the non-volatile memory cell according to the third embodiment of the present invention.
Figure 10:
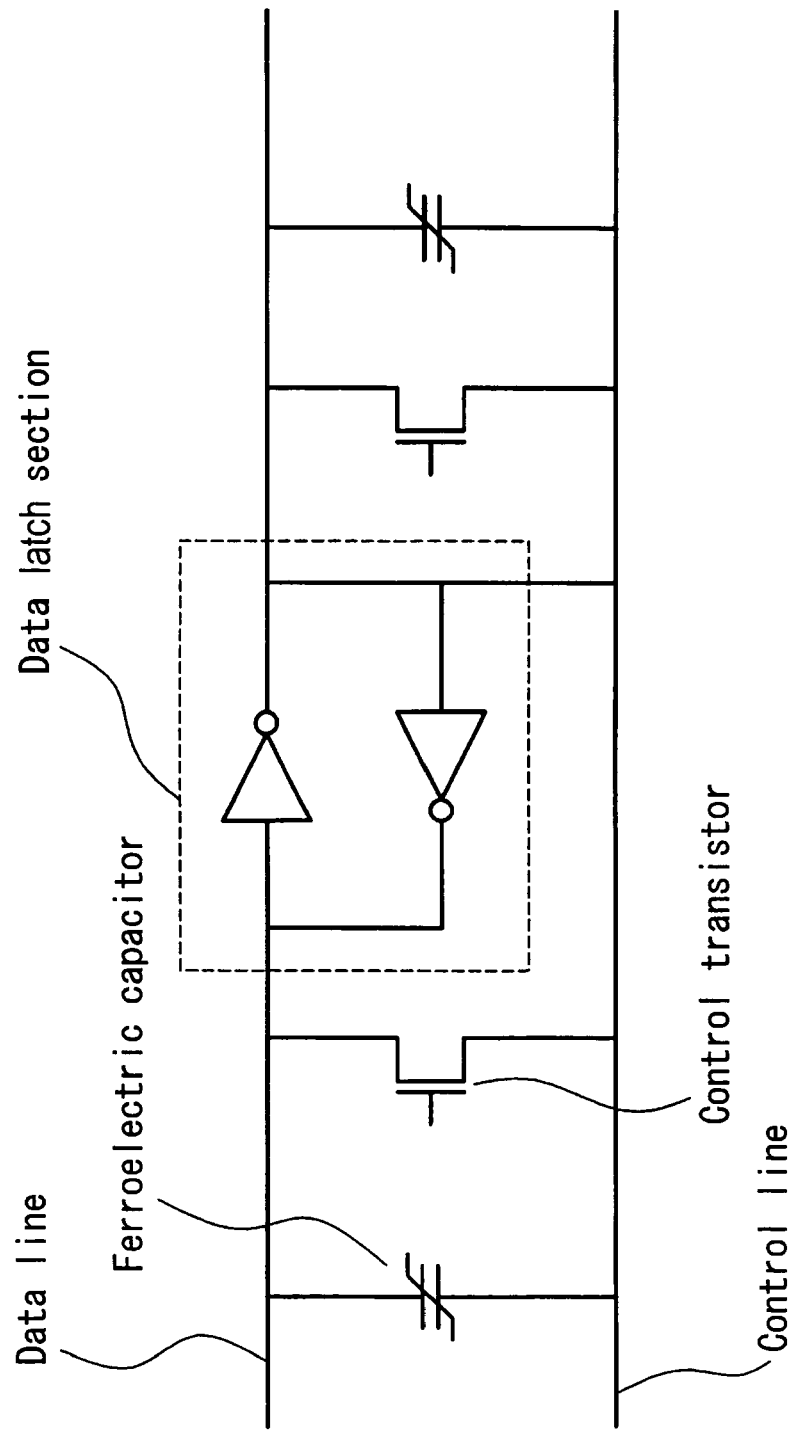
FIG. 10 is a circuit diagram showing the shadow RAM disclosed in reference 1.
Figure 11:
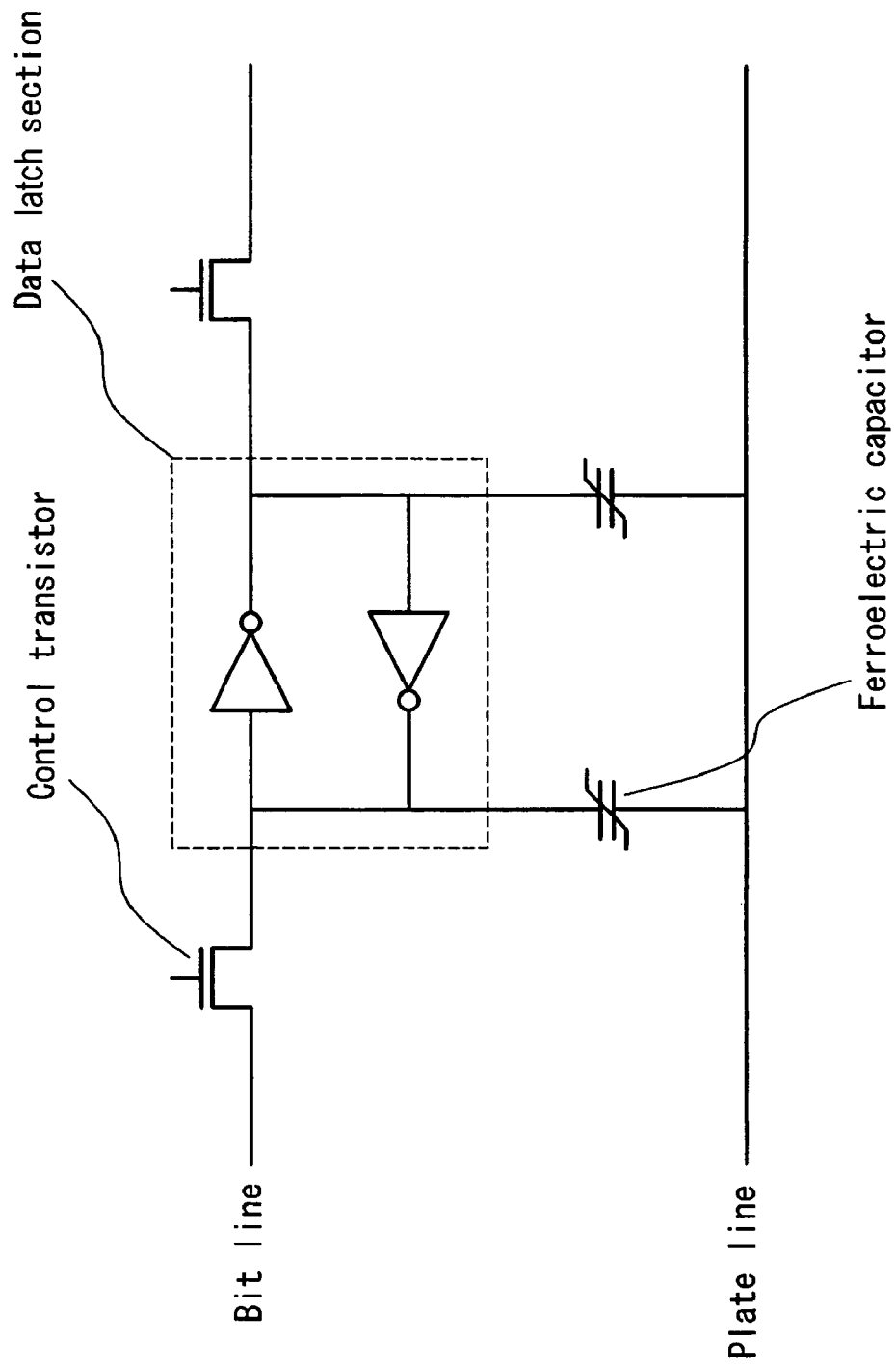
FIG. 11 is a circuit diagram showing the shadow RAM disclosed in reference 2.

FIG. 9 is the timing chart of the operation of the non-volatile memory cell according to this embodiment shown in FIG. 8. In FIG. 9, CE represents the potential of the gates of the first control element 31 and the second control element 32. The other symbols have the same meaning as those in FIG. 7.

Since the normal flip-flop operation (the period during which the mode is "normal operation" in FIG. 9) of the memory cell shown in FIG. 8 is nearly the same as that of the first embodiment, its detailed description is omitted. However, the following point should be noted: In normal flip-flop operation, WE is always at a high level; the first and second switching elements 4 and 5 are in the ON state; FE is always at a low level; and the first and second ferroelectric capacitor select elements 21 and 22 are in the OFF state. Therefore, as shown in FIG. 9, each time CE becomes high, Q1 and Q2 of the first and second nodes 6 and 7 become equal to D1 and D2 at that time, respectively.

In the STORE operation (period when the mode is "STORE operation" in FIG. 9), before power to the non-volatile memory cell is removed, complementary data are set in the first and second data input/output lines 2 and 3; CE is then increased to a high level so that the first and second control elements 31 and 32 are turned on; and at the same time WE is changed to a low level so that the first and second switching elements 4 and 5 are turned off, and FE is changed to a high level so that the first and second ferroelectric capacitor select elements 21 and 22 are turned on. Accordingly, the first and second ferroelectric capacitors 8a and 8b become polarized in a certain manner, and data is stored. Since the potentials D1 and D2 of the first and second data input/output lines 2 and 3 are set to the potentials corresponding to the latched data at this time, the first and second switching elements 4 and 5 may be in the ON state. The STORE can be steadily performed by setting the potentials D1 and D2 of the first and second data input/output lines 2 and 3 to those corresponding to the latched data.

It is also possible to perform the STORE operation in the ferroelectric capacitors by the following procedure: CE is set to a low level and the first and second controlling elements 31 and 32 are turned off; both WE and FE are changed to a high level so that the first and second switching elements 4 and 5 and the first and second ferroelectric capacitor select elements 21 and 22 are turned on, thereby using only the complementary data latched into the first and second nodes 6 and 7. After the STORE operation is completed, WE is set to a low level and the first and second switching elements 4 and 5 are turned off.

After the STORE, the power line of the inverters of the latch circuit 1 is set to the ground potential, and then the first and second switching elements 4 and 5, the first and second ferroelectric capacitor select elements 21 and 22, and the first and second control elements 31 and 32 are turned ON, and then the potentials D1 and D2 of the first and second data input/output lines 2 and 3 are set to the ground potential. Thereafter, power to the memory cell is removed. By this procedure, the potentials of both terminals of each of the first and second ferroelectric capacitors 8a and 8b are set to the ground potential. This is because it is desirable in terms of operational stability, as in the first and second embodiments.

As shown in the recall operation mode in FIG. 9, the RECALL operation is performed in the state that CE is at a high level and the first and second controlling elements 31 and 32 are in the ON state, in a manner similar to that described in the second embodiment. Specifically, when power supply to the non-volatile memory cell is started, firstly, in the state that the potential VDDL of the power line of the inverters which constitute the latch circuit 1 is set to the ground potential, and in the state that the potentials D1 and D2 of the first and second data input/output lines 2 and 3 are both set to the ground potential, WE, FE and CE are changed to a high level so that the first and second switching elements 4 and 5, the first and second ferroelectric capacitor select elements 21 and 22, and the first and second control elements 31 and 32 are turned on. By this procedure, the potentials of the first and second nodes 6 and 7 are set to the same ground potential.

Secondly, while maintaining FE and CE at a high level and maintaining the first and second ferroelectric capacitor select elements 21 and 22 and the first and second control elements 31 and 32 in the ON state, WE is changed to a low level so that the first and second switching elements 4 and 5 are turned off. Then, the potential VDDL of the power line of the inverters which constitute the latch circuit 1 is increased.

Accordingly, when the RECALL operation is performed after the STORE operation is performed in the state that D1 and D2 are at a high level and a low level, respectively, as in the first and second embodiments, and the potential of the power line of the inverters which constitute the latch circuit 1 is increased, the potential increasing rate of the second node 7 which is connected to the second ferroelectric capacitor 8b becomes lower than that of the first node 6 which is connected to the first ferroelectric capacitor 8a. This delay creates a difference in the potentials of the first node 6 and second node 7. When this difference exceeds the threshold potential of the inverters which constitute the latch circuit 1, the potentials of the first and second nodes 6 and 7 change to the supply potential and ground potential, respectively. Thus, the RECALL operation is completed.

Described above is the case where the RECALL operation is performed after the STORE operation is performed with D1 and D2 at a high level and a low level, respectively. However, unlike in this case, when the STORE operation is performed with D1 and D2 at a low level and a high level, respectively, the potentials of the first and second nodes 6 and 7 are set to the ground potential and supply potential, respectively, by the RECALL operation. In other words, the stored potential states of the nodes can be recalled in both cases.

As seen from the above, according to the non-volatile memory cell of this embodiment and the method of controlling the same, as in the first embodiment, operations of both a normal flip-flop and a non-volatile memory can be achieved without using special additional electric wires. Furthermore, as in the second embodiment, high-speed and stable operation and reduced power consumption can be achieved in normal flip-flop operation.

INDUSTRIAL APPLICABILITY

The present invention can provide a non-volatile memory cell which operates at high speed and in a stable manner with reduced power consumption in normal flip-flop operation without increasing the number of electric wires, and a method for controlling the same. Therefore, the present invention can be applied to devices with a large number of electric wires, such as FPGAs.

What is claimed is:

1. A non-volatile memory cell comprising:
    a latch circuit which comprises a first node and a second node and latches complementary data set in the first node and second node;
    a first switching element which connects the first node to a first data input/output line;
    a second switching element which connects the second node to a second data input/output line;
    a first ferroelectric capacitor which connects the second data input/output line to the first node; and
    a second ferroelectric capacitor which connects the first data input/output line to the second node.

2. A non-volatile memory cell according to claim 1,
    in which the latch circuit comprises a first inverter and a second inverter;
    the first inverter comprising a first transistor and a second transistor which complement each other and are serially connected between a power line and ground;
    the second inverter comprising a third transistor and a fourth transistor which complement each other and are serially connected between the power line and ground;
    the first and second transistors each having a gate and a drain, the gates of the first and second transistors being connected to the first node and the drains of the first and second transistors being connected to the second node; and
    the third and fourth transistors each having a gate and a drain, the gates of the third and fourth transistors being connected to the second node and the drains of the third and fourth transistors being connected to the first node.

3. A non-volatile memory cell according to claim 1,
    in which the latch circuit comprises a first inverter and second inverter;
    the first inverter comprising a first resistor and a first transistor which are serially connected between a power line and ground;
    the second inverter comprising a second resistor and a second transistor which are serially connected between the power line and ground;
    a gate of the first transistor being connected to the first node;
    a source of the first transistor being connected to the second node;
    a gate of the second transistor being connected to the second node;
    a source of the second transistor being connected to the first node;
    the resistance value of the first resistor being higher than the ON-resistance value of the first transistor; and
    the resistance value of the second resistor being higher than the ON-resistance value of the second transistor.

4. A method of controlling a non-volatile memory cell comprising:
    a latch circuit which comprises a first node and a second node and latches complementary data set in the first node and the second node;
    a first switching element which connects the first node to a first data input/output line;
    a second switching element which connects the second node to a second data input/output line;
    a first ferroelectric capacitor which connects the second data input/output line to the first node; and
    a second ferroelectric capacitor which connects the first data input/output line and the second node;
    the method comprising a STORE step and a RECALL step;

the STORE step comprising setting the potential of one of the first and second data input/output lines to a high level, setting the potential of the other data input/output line to a low level and turning on the first and second switching elements;

the RECALL step comprising a first substep and a second substep;

the first substep comprising setting the potential of a power line of the latch circuit to a ground potential, setting the potentials of the first and second data input/output lines to the ground potential and turning on the first and second switching elements;

the second substep, which follows the first substep, comprising, in the state that the potentials of the first and second data input/output lines are maintained at the ground potential, turning off the first and second switching elements and increasing the potential of the power line of the latch circuit.

5. A method of controlling a non-volatile memory cell according to claim 4, in which the STORE step further comprises:

setting the potential of the power line of the latch circuit to the ground potential, turning on the first and second switching elements, setting the potentials of the first and second data input/output lines to the ground potential and removing power to the non-volatile memory cell.

6. A non-volatile memory cell comprising:

a latch circuit which comprises a first node and a second node and latches complementary data set in the first node and the second node;

a first switching element which connects the first node to a first data input/output line;

a second switching element which connects the second node to a second data input/output line;

a first ferroelectric capacitor and a second ferroelectric capacitor select element which are serially connected between the second data input/output line and the first node; and a second ferroelectric capacitor and a first ferroelectric capacitor select element which are serially connected between the first data input/output line and the second node;

the first ferroelectric capacitor being connected to the first node; and the second ferroelectric capacitor being connected to the second node.

7. A non-volatile memory cell according to claim 6, in which the latch circuit comprises a first inverter and a second inverter;

the first inverter comprising a first transistor and a second transistor which complement each other and are serially connected between a power line and ground;

the second inverter comprising a third transistor and fourth transistor which complement each other and are serially connected between the power line and ground;

the first and second transistors each having a gate and a drain, the gates of the first and second transistors being connected to the first node and the drains of the first and second transistors being connected to the second node; and the third and fourth transistors each having a gate and a drain, the gates of the third and fourth transistors being connected to the second node and the drains of the third and fourth transistors being connected to the first node.

8. A non-volatile memory cell according to claim 6, in which the latch circuit comprises a first inverter and a second inverter;

the first inverter comprising a first resistor and a first transistor which are serially connected between a power line and ground;

the second inverter comprising a second resistor and a second transistor which are serially connected between the power line and ground;

a gate of the first transistor being connected to the first node;

a source of the first transistor being connected to the second node;

a gate of the second transistor being connected to the second node;

a source of the second transistor being connected to the first node;

the resistance value of the first resistor being higher than the ON-resistance value of the first transistor; and the resistance value of the second resistor being higher than the ON-resistance value of the second transistor.

9. A method of controlling a non-volatile memory cell comprising:

a latch circuit which comprises a first node and a second node and latches complementary data set in the first and second nodes;

a first switching element which connects the first node to a first data input/output line;

a second switching element which connects the second node to a second data input/output line;

a first ferroelectric capacitor and a second ferroelectric capacitor select element which are serially connected between the second data input/output line and the first node; and a second ferroelectric capacitor and a first ferroelectric capacitor select element which are serially connected between the first data input/output line and the second node;

the first ferroelectric capacitor being connected to the first node; and the second ferroelectric capacitor being connected to the second node;

the method comprising a WRITE step, a READ step, a STORE step and a RECALL step;

the WRITE step comprising turning off the first and second ferroelectric capacitor select elements; setting the potential of one of the first and second data input/output lines to a high level and the potential of the other data input/output line to a low level, turning on the first and second switching elements, and setting the potentials of the first and second nodes to those of the first and second data input/output lines respectively;

the READ step comprising turning off the first and second ferroelectric capacitor select elements, turning on the first and second switching elements, and setting the potentials of the first and second data input/output lines to those of the first and second nodes respectively;

the STORE step comprising, in the state that complementary data are latched into the latch circuit, turning on the first and second ferroelectric capacitor select elements and the first and second switching elements;

the RECALL step comprising a first substep and a second substep;

the first substep comprising setting the potential of a power line of the latch circuit to the ground potential, setting the potentials of the first and second data input/output lines to the ground potential, and turning on the first and second switching elements and the first and second ferroelectric capacitor select elements; and the second substep, which follows the first substep, comprising, in the state that the first and second ferroelectric capacitor select elements are maintained in the ON state and the potentials of the first and second data input/output lines are maintained at the ground potential, turning off the first and second switching elements and increasing the potential of the power line of the latch circuit.

10. A method of controlling a non-volatile memory cell according to claim 9, in which the STORE step further comprises setting the potential of the power line of the latch circuit to the ground potential, turning on the first and second switching elements and the first and second ferroelectric capacitor select elements, setting the potentials of the first and second data input/output lines to the ground potential and removing power to the non-volatile memory cell.

11. A method of controlling a non-volatile memory cell comprising:

a latch circuit which comprises a first node and a second node and latches complementary data set in the first and second nodes;

a first switching element which connects the first node to a first data input/output line;

a second switching element which connects the second node to a second data input/output line;

a first ferroelectric capacitor and a second ferroelectric capacitor select element which are serially connected between the second data input/output line and the first node; and a second ferroelectric capacitor and a first ferroelectric capacitor select element which are serially connected between the first data input/output line and the second node;

the first ferroelectric capacitor being connected to the first node; and the second ferroelectric capacitor being connected to the second node;

the method comprising a WRITE step, a READ step, a STORE step and a RECALL step;

the WRITE step comprising turning off the first and second ferroelectric capacitor select elements; setting the potential of one of the first and second data input/output lines to a high level and the potential of the other data input/output line to a low level, turning on the first and second switching elements, and setting the potentials of the first and second nodes to those of the first and second data input/output lines respectively;

the READ step comprising turning off the first and second ferroelectric capacitor select elements, turning on the first and second switching elements, and setting the potentials of the first and second data input/output lines to those of the first and second nodes respectively;

the STORE step comprising setting the potential of one of the first and second data input/output lines to a high level and setting the potential of the other data input/output line to a low level, according to the complementary data latched into the latch circuit, and turning on the first and second ferroelectric capacitor select elements;

the RECALL step comprising a first substep and a second substep;

the first substep comprising setting the potential of a power line of the latch circuit to the ground potential, setting the potentials of the first and second data input/output lines to the ground potential and turning on the first and second switching elements and the first and second ferroelectric capacitor select elements; and the second substep, which follows the first substep, comprising, in the state that the first and second ferroelectric capacitor select elements are maintained in the ON state and the potentials of the first and second data input/output lines are maintained at the ground potential, turning off the first and second switching elements and increasing the potential of the power line of the latch circuit.

12. A method of controlling a non-volatile memory cell according to claim 11, in which the STORE step further comprises:

setting the potential of the power line of the latch circuit to the ground potential, turning on the first and second switching elements and the first and second ferroelectric capacitor select elements, setting the potentials of the first and second data input/output lines to the ground potential and removing power to the non-volatile memory cell.

13. A non-volatile memory cell comprising:

a latch circuit which comprises a first node and a second node and latches complementary data set in the first and second nodes;

a first switching element and a first control element which are serially connected between the first node and a first data input/output line;

a second switching element and a second control element which are serially connected between the second node and a second data input/output line;

a second ferroelectric capacitor and a first ferroelectric capacitor select element which are serially connected between the second node and a third node, the third node serially connecting the first switching element and the first control element; and a first ferroelectric capacitor and a second ferroelectric capacitor select element which are serially connected between the first node and a fourth node, the fourth node serially connecting the second switching element and the second control element;

the first switching element being connected to the first node;

the second switching element being connected to the second node;

the first ferroelectric capacitor being connected to the first node; and the second ferroelectric capacitor being connected to the second node.

14. A non-volatile memory cell according to claim 13, in which the latch circuit comprises a first inverter and a second inverter, the first inverter comprising a first transistor and a second transistor which complement each other and are serially connected between a power line and ground;

the second inverter comprising a third transistor and a fourth transistor which complement each other and are serially connected between the power line and ground;

the first and second transistors each having a gate and a drain, the gates of the first and second transistors being connected to the first node and the drains of the first and second transistors being connected to the second node;

the third and fourth transistors each having a gate and a drain, the gates of the third and fourth transistors being connected to the second node and the drains of the third and fourth transistors being connected to the first node.

15. A non-volatile memory cell according to claim 13,
in which the latch circuit comprises a first inverter and a
second inverter;
the first inverter comprising a first resistor and a first
transistor which are serially connected between a
power line and ground;
the second inverter comprising a second resistor and a
second transistor which are serially connected between
the power line and ground;
a gate of the first transistor being connected to the first
node;
a source of the first transistor being connected to the
second node;
a gate of the second transistor being connected to the
second node;
a source of the second transistor being connected to the
first node;
the resistance value of the first resistor being higher than
the ON-resistance value of the first transistor; and
the resistance value of the second resistor being higher
than the ON-resistance value of the second transistor.

16. A method of controlling a non-volatile memory cell
comprising:
a latch circuit which comprises a first node and a second
node and latches complementary data set in the first and
second nodes;
a first switching element and a first control element which
are serially connected between the first node and a first
data input/output line;
a second switching element and a second control element
which are serially connected between the second node
and a second data input/output line;
a second ferroelectric capacitor and a first ferroelectric
capacitor select element which are serially connected
between the second node and a third node, the third
node serially connecting the first switching element and
the first control element; and
a first ferroelectric capacitor and a second ferroelectric
capacitor select element which are serially connected
between the first node and a fourth node, the fourth
node serially connecting the second switching element
and the second control element;
the first switching element being connected to the first
node;
the second switching element being connected to the
second node;
the first ferroelectric capacitor being connected to the first
node; and
the second ferroelectric capacitor being connected to the
second node;
the method comprising a WRITE step, a READ step, a
STORE step and a RECALL step;
the WRITE step comprising turning off the first and
second ferroelectric capacitor select elements; setting
the potential of one of the first and second data input/
output lines to a high level and the potential of the other
data input/output line to a low level, turning on the first
and second switching elements and the first and second
control elements, and setting the potentials of the first
and second nodes to those of the first and second data
input/output lines respectively;
the READ step comprising turning off the first and second
ferroelectric capacitor select elements; turning on the
first and second switching elements and the first and
second control elements, and setting the potentials of
the first and second data input/output lines to those of
the first and second nodes respectively;

the STORE step comprising setting the potential of one of
the first and second data input/output lines to a high
level and the potential of the other data input/output
line to a low level, according to the complementary
data latched into the latch circuit, and turning on the
first and second control elements and the first and
second ferroelectric capacitor select elements;
the RECALL step comprising a first substep and a second
substep;
the first substep comprising setting the potential of a
power line of the latch circuit to the ground potential,
setting the potentials of the first and second data
input/output lines to the ground potential, and turning
on the first and second switching elements, the first and
second ferroelectric capacitor select elements and the
first and second control elements;
the second substep, which follows the first substep, comprising, in the state that the first and second ferroelectric capacitor select elements and the first and second
control elements are maintained in the ON state and the
potentials of the first and second data input/output lines
are maintained at the ground potential, turning off the
first and second switching elements and increasing the
potential of the power line of the latch circuit.

17. A method of controlling a non-volatile memory cell
according to claim 16, in which the STORE step further
comprises:
setting the potential of the power line of the latch circuit
to the ground potential, turning on the first and second
switching elements, the first and second ferroelectric
capacitor select elements and the first and second
control elements, setting the potentials of the first and
second data input/output lines to the ground potential
and removing power to the non-volatile memory cell.

18. A method of controlling a non-volatile memory cell
comprising:
a latch circuit which comprises a first node and a second
node and latches complementary data set in the first and
second nodes;
a first switching element and a first control element which
are serially connected between the first node and a first
data input/output line;
a second switching element and a second control element
which are serially connected between the second node
and a second data input/output line;
a second ferroelectric capacitor and a first ferroelectric
capacitor select element which are serially connected
between the second node and a third node, the third
node serially connecting the first switching element and
the first control element; and
a first ferroelectric capacitor and a second ferroelectric
capacitor select element which are serially connected
between the first node and a fourth node, the fourth
node serially connecting the second switching element
and the second control element;
the first switching element being connected to the first
node;
the second switching element being connected to the
second node;
the first ferroelectric capacitor being connected to the first
node; and
the second ferroelectric capacitor being connected to the
second node;
the method comprising a WRITE step, a READ step, a
STORE step and a RECALL step;
the WRITE step comprising turning off the first and
second ferroelectric capacitor select elements, setting the potential of one of the first and second data input/output lines to a high level and the potential of the other data input/output line to a low level, turning on the first and second switching elements and the first and second control elements, and setting the potentials of the first and second nodes to those of the first and second data input/output lines respectively;

the READ step comprising turning off the first and second ferroelectric capacitor select elements, turning on the first and second switching elements and the first and second control elements, and setting the potentials of the first and second data input/output lines to those of the first and second nodes respectively;

the STORE step comprising, in the state that complementary data are latched into the latch circuit; turning off the first and second control elements and turning on the first and second switching elements and the first and second ferroelectric capacitor select elements;

the RECALL step comprising a first substep and a second substep;

the first substep comprising setting the potential of a power line of the latch circuit to the ground potential, setting the potentials of the first and second data input/output lines to the ground potential, and turning on the first and second switching elements, the first and second ferroelectric capacitor select elements and the first and second control elements;

the second substep, which follows the first substep, comprising, in the state that the first and second ferroelectric capacitor select elements and the first and second control elements are maintained in the ON state and the potentials of the first and second data input/output lines are maintained at the ground potential, turning off the first and second switching elements and increasing the potential of the power line of the latch circuit.

19. A method of controlling a non-volatile memory cell according to claim 18, in which the STORE step further comprises setting the potential of the power line of the latch circuit to the ground potential, turning on the first and second switching elements, the first and second ferroelectric capacitor select elements and the first and second control elements, setting the potentials of the first and second data input/output lines to the ground potential and removing power to the non-volatile memory cell.

* * * * *